United States Patent
Kim

(10) Patent No.: US 8,450,833 B2
(45) Date of Patent: May 28, 2013

(54) SPACER DOUBLE PATTERNING THAT PRINTS MULTIPLE CD IN FRONT-END-OF-LINE

(75) Inventor: Ryoung-han Kim, Clifton Park, NY (US)

(73) Assignee: GlobalFoundries Inc., Grand Cayman (KY)

( * ) Notice: Subject to any disclaimer, the term of this patent is extended or adjusted under 35 U.S.C. 154(b) by 336 days.

(21) Appl. No.: 12/860,327

(22) Filed: Aug. 20, 2010

(65) Prior Publication Data

US 2012/0043646 A1 Feb. 23, 2012

(51) Int. Cl.
*H01L 29/06* (2006.01)
*H01L 21/033* (2006.01)

(52) U.S. Cl.
USPC .......... 257/618; 257/E21.039; 438/942; 438/946; 977/707; 977/708; 977/721; 977/882; 977/887; 977/895

(58) Field of Classification Search
CPC .............. H01L 21/02104; H01L 21/033; H01L 21/0334; H01L 21/0338
USPC .............. 977/707, 708, 721, 882, 887–893, 977/895; 257/618, E21.215, E21.039; 438/694–703, 942, 717, 946
See application file for complete search history.

(56) References Cited

U.S. PATENT DOCUMENTS

| | | | | |
|---|---|---|---|---|
| 7,576,010 B2* | 8/2009 | Lee et al. | ...... | 438/717 |
| 8,067,314 B2* | 11/2011 | Davis et al. | ...... | 438/717 |
| 8,071,484 B2* | 12/2011 | Kim et al. | ...... | 438/717 |
| 2007/0249170 A1* | 10/2007 | Kewley | ...... | 438/706 |

* cited by examiner

*Primary Examiner* — Marcos D. Pizarro
*Assistant Examiner* — Diana C Vieira
(74) *Attorney, Agent, or Firm* — Ditthavong Mori & Steiner, P.C.

(57) ABSTRACT

A semiconductor device is formed with sub-resolution features and at least one additional feature having a relatively larger critical dimension using only two masks. An embodiment includes forming a plurality of first mandrels, having a first width, and at least one second mandrel, having a second width greater than the first width, overlying a target layer using a first mask, forming sidewall spacers along the length and width of the first and second mandrels, forming a filler adjacent each sidewall spacer, the filler having the first width, removing the filler adjacent sidewall spacers along the widths of the first and second mandrels using a second mask, removing the sidewall spacers, and etching the target layer between the filler and the first and second mandrels, thereby forming at least two target features with different critical dimensions. Embodiments further include using a third mask to form a semiconductor device having further features with a different critical dimension, but the same pitch, as the sub-resolution features.

17 Claims, 15 Drawing Sheets

SPACER DOUBLE PATTERNING THAT PRINTS MULTIPLE CD IN FRONT-END-OF-LINE

TECHNICAL FIELD

The present disclosure relates the fabrication of semiconductor devices having accurately formed ultrafine design features with multiple critical dimensions. The present disclosure is particularly applicable to semiconductor devices in 22 nanometer (nm) technology nodes and beyond.

BACKGROUND

Double patterning is employed to print features, especially those with a pitch of 72 nm or less, which is below the resolution limit of conventional lithography. However, double patterning requires at least two masks, which are expensive. To define two or more critical dimensions or pitches, at least three masks must be employed. To lower the cost of double patterning, the number of masks must be reduced.

As illustrated in FIGS. 1A through 1I, prior methods of fabricating a logic device require three or more masks to print multiple critical dimensions in the gate layer or in the active layer. Adverting to FIG. 1A, a target layer 101 is formed on a substrate 103. Target layer 101 may be the gate layer or active silicon layer. An inorganic layer 105 and an organic bottom antireflection coating (BARC) layer 107 are formed on target layer 101. Using a first mask, mandrels 109 are formed on BARC layer 107.

As illustrated in FIG. 1B, a spacer layer 111 is deposited over the entire substrate, and then etched back to form sidewall spacers 113 (shown in FIG. 1C). The width of the sidewall spacers 113 defines a first critical dimension. Adverting to FIG. 1D, the mandrels are removed and BARC layer 107 and inorganic layer 105 are etched through sidewall spacers 113. Sidewall spacers 113 are then removed, and BARC layer 107 is deposited over the entire substrate to fill the spaces between inorganic layer 105 and form a substantially planarized layer. Subsequently, a second mask is formed on BARC layer 107, exposing an area where features having a second critical dimension are to be formed. (See FIG. 1E.) As illustrated in FIG. 1F, BARC layer 107 is etched with second mask 115, thereby exposing some of inorganic layer 105 to air, and then second mask 115 is removed. As illustrated in FIG. 1G, the exposed inorganic layer 105 and remaining BARC layer 107 are then removed.

Adverting to FIG. 1H, a third mask is employed to form a structure on target layer 101 having the second critical dimension. Subsequently, as illustrated in FIG. 1I, target layer 101 is etched through inorganic layer 105 and structure 117 to form target features 119 having the first dimension and target feature 121 having the second dimension, and inorganic layer 105 and structure 117 are removed. As demonstrated, three etching steps using three masks are necessary. Further, to add target elements having a third critical dimension, but the same pitch as the first target elements, such as for a wimpy device, at least one additional mask and etching step would be required.

A need therefore exists for methodology enabling the formation of two critical dimensions or two pitches, or three critical dimensions with two pitches, while minimizing the number of masks employed.

SUMMARY

An aspect of the present disclosure is a method of fabricating a semiconductor device having features with multiple critical dimensions and multiple pitches using only two masks.

Another aspect of the present disclosure is a semiconductor device with multiple critical dimensions but the same pitch.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method of fabricating a semiconductor device, the method comprising: forming a plurality of first mandrels and at least one second mandrel overlying a target layer using a first mask, the first mandrels having a first width and the at least one second mandrel having a second width, the second width being greater than the first width, each of the first and second mandrels having a length; forming sidewall spacers along the length and width of the first and second mandrels; forming a filler adjacent each sidewall spacer, the filler having the first width; removing the filler adjacent sidewall spacers along the widths of the first and second mandrels using a second mask; removing the sidewall spacers; and etching the target layer between the filler and the first and second mandrels, thereby forming at least two target features with different dimensions using only two masks.

Aspects of the present disclosure include forming the sidewall spacers by conformally depositing a spacer material over the first and second mandrels and the target layer. Further aspects include removing the spacer material between adjacent sidewall spacers prior to forming the filler. Another aspect includes removing the spacers prior to using the second mask. Additional aspects include removing the spacer material between adjacent sidewall spacers prior to forming the filler. Other aspects include the first width being less than 40 nanometers and the second width being greater than 20 nanometers and greater than the first width. Another aspect includes the target layer comprising an active silicon layer. Further aspects include the target layer comprising a gate material.

Another aspect of the present disclosure is a semiconductor device comprising: a substrate; a target layer on the substrate; and first target features having a first critical dimension, second target features having a second critical dimension, and a third target feature having a third critical dimension all formed in the target layer, the first, second, and third critical dimensions all being different from each other, wherein a pitch between the first target features equals a pitch between the second target features.

Aspects include a semiconductor device wherein the target layer comprises a gate material. Further aspects include features wherein the pitch between the first target features and between the second target features are between 40 nm and 80 nm. Another aspect includes devices wherein the first critical dimension is 1 nm to 2 nm greater than the second critical dimension. Additional aspects include devices wherein the target layer comprises an active silicon layer.

Another aspect of the present disclosure is a method of fabricating a semiconductor device, the method comprising: forming a plurality of first mandrels and at least one second mandrel overlying a target layer using a first mask, the first mandrels having a first width and the at least one second mandrel having a second width, the second width being greater than the first width, each of the first and second mandrels having a length; forming first sidewall spacers along the length and width of the first and second mandrels; forming a filler adjacent each first sidewall spacer, the filler having the first width; removing the filler adjacent first sidewall spacers along the widths of the first and second mandrels using a second mask; removing the sidewall spacers; forming second sidewall spacers on at least one first mandrel and an adjacent filler using a third mask; and etching the target layer between the second sidewall spacers, between the second sidewall spacers and the adjacent mandrel or filler, and between the filler and the first and second mandrels, thereby forming first, second, and third target features with different dimensions using only three masks, wherein the pitch between the first target features equals the pitch between the second target features.

Aspects of the present disclosure include forming the first sidewall spacers by conformally depositing a spacer material over the first and second mandrels and the target layer. Further aspects include removing the spacer material between adjacent first sidewall spacers prior to forming the filler. Another aspect includes removing the first sidewall spacers prior to using the second mask. Additional aspects include removing the spacer material between adjacent first sidewall spacers prior to forming the filler. Other aspects include the target layer comprising a gate material.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

Figure 1A:
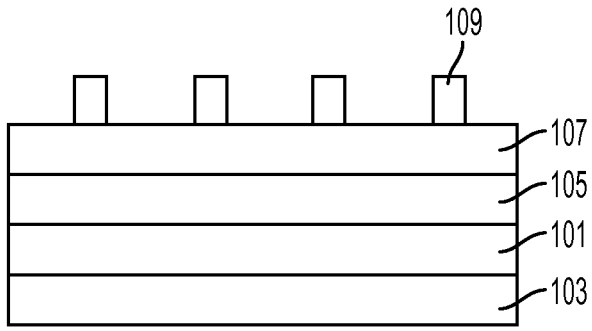
FIGS. 1A through 1I schematically illustrate a prior art method of forming a semiconductor device with features having two critical dimensions and two pitches.
Figure 1B:
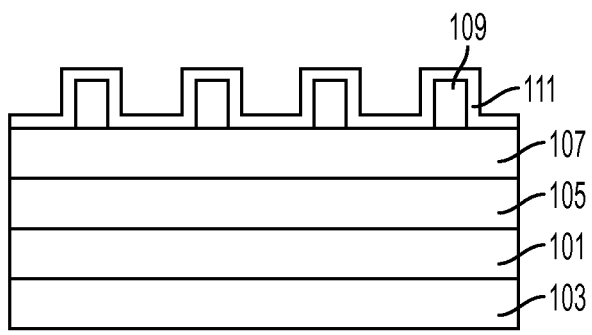
Figure 1C:
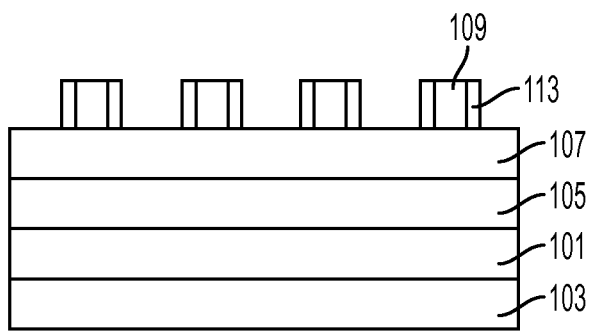
Figure 1D:
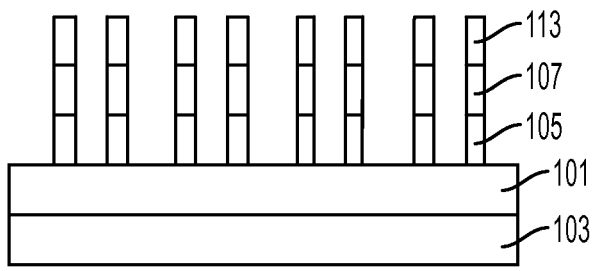
Figure 1E:
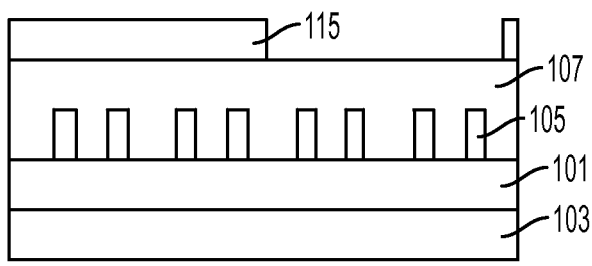
Figure 1F:
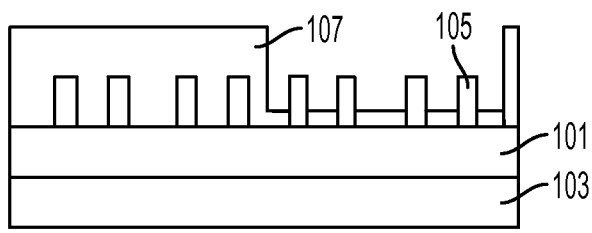
Figure 1G:
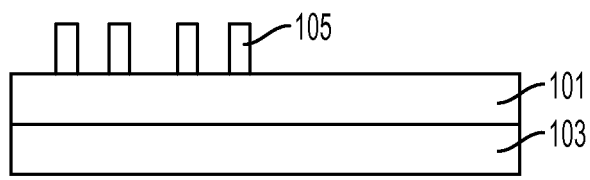
Figure 1H:
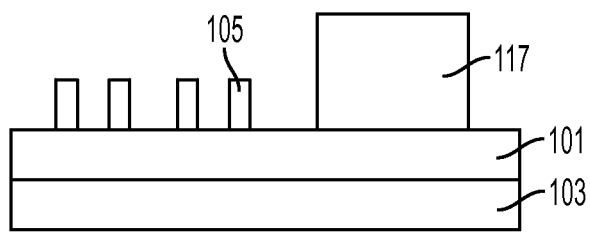
Figure 1I:
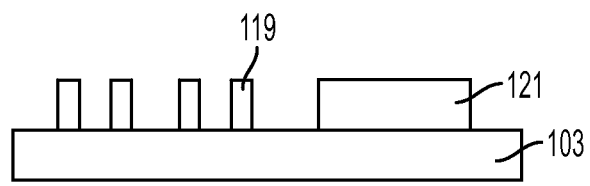

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure enables a reduction in the number of masks required for forming target features having different critical dimensions and different pitches. In accordance with embodiments of the present disclosure, only two masks are employed to form features in a target layer, for example an active silicon layer or a gate layer, with at least one feature having a different critical dimension from other features. A first mask is employed to form mandrels having different widths, sidewall spacers are formed on the mandrels, a material is deposited to fill the spaces between the spacers, the spacers are removed, a second mask is employed for removing unwanted mandrels and filler material, such as around the edges, and the remaining structures are used to etch an underlying target layer.

Methodology in accordance with embodiments of the present disclosure includes forming a plurality of first mandrels and at least one second mandrel overlying a target layer using a first mask, the first mandrels having a first width and the at least one second mandrel having a second width, the second width being greater than the first width, each of the first and second mandrels having a length, forming sidewall spacers along the length and width of the first and second mandrels, forming a filler adjacent each sidewall spacer, the filler having the first width, removing the filler adjacent sidewall spacers along the widths of the first and second mandrels using a second mask, removing the sidewall spacers, and etching the target layer between the filler and the first and second mandrels, thereby forming at least two target features with different dimensions using only two masks.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

A method of fabricating a semiconductor device in accordance with an embodiment of the present disclosure is schematically illustrated in FIGS. 2A through 2H. Adverting to FIG. 2A, a target layer 201 is formed on a substrate 203. A first layer 205 is formed on target layer 201. The first layer 205 is used as a hard mask for the target layer or may be the target layer itself. Using a first mask (not shown for illustrative convenience), mandrels 207 having a first critical dimension and mandrels 209 having a second critical dimension are formed on first layer 205. A spacer layer 211 is then conformally deposited over the entire substrate. Target layer 201 may be formed of a high-k metal gate material or of silicon for a gate layer or formed of silicon or silicon on insulator (SOI) for an active silicon layer of a FinFET device. Mandrels 207 and 209 may be formed of polysilicon, a photoresist, or any suitable material that has etch selectivity with spacer layer 211. Spacer layer 211 may be formed of silicon nitride, silicon dioxide, or any type of organic/inorganic material having etch selectivity with respect to mandrels 207 and 209. For polysilicon mandrels, first layer 205 may be formed of an inorganic material, such as silicon dioxide (SiO$_2$). When a resist is employed for the mandrels, first layer 205 may be either an Applied Materials advanced patterning film (AMAT APF), such as amorphous carbon, or a silicon containing organic underlayer, such as Shin Etsu SHB series, plus an underlayer, such as ShinEtsu ODL or JSR HM series.

Figure 2A:
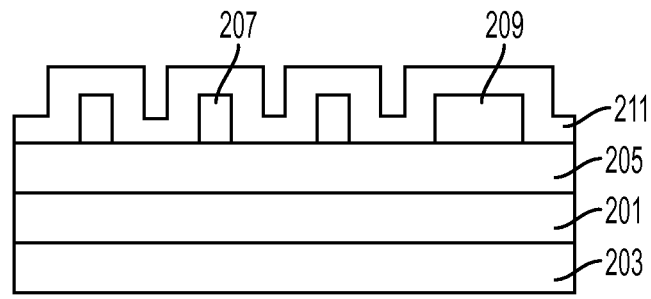
FIGS. 2A through 2H schematically illustrate sequential steps of a method in accordance with an exemplary embodiment.
Figure 2B:
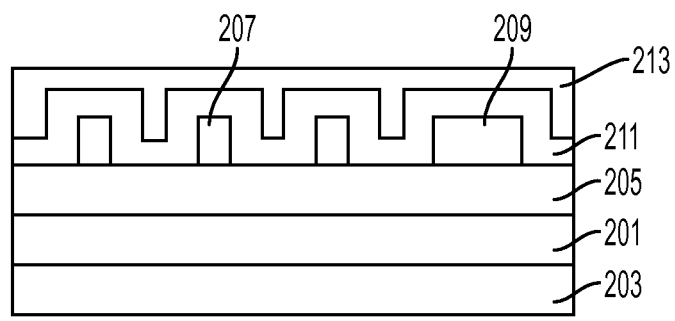

As illustrated in FIG. 2B, a second layer 213 is deposited over the entire substrate, filling the spaces between the mandrels 207 and 209. Second layer 213 may formed of silicon nitride, silicon, silicon dioxide, or an organic spin coatable material, such as ShinEtsu SiTH series, that has etch selectivity with the spacer material.

Figure 2C:
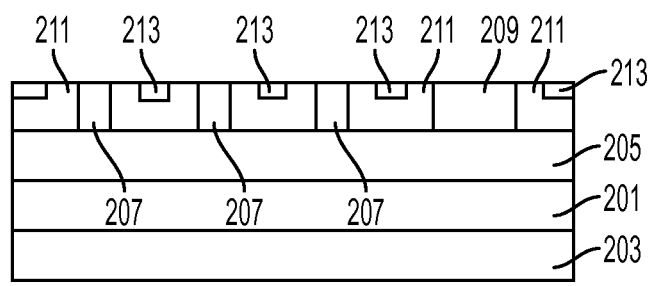
Figure 2D:
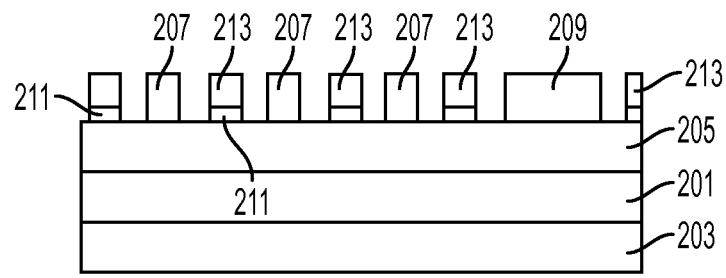
Figure 3A:
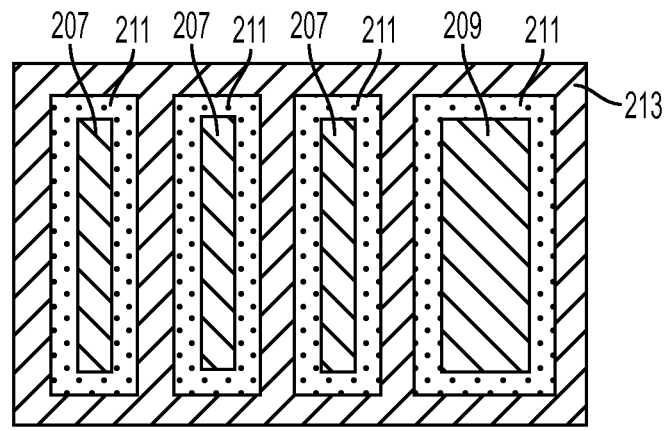
FIGS. 3A through 3D schematically illustrate a top view of steps 2C through 2F.
Figure 3B:
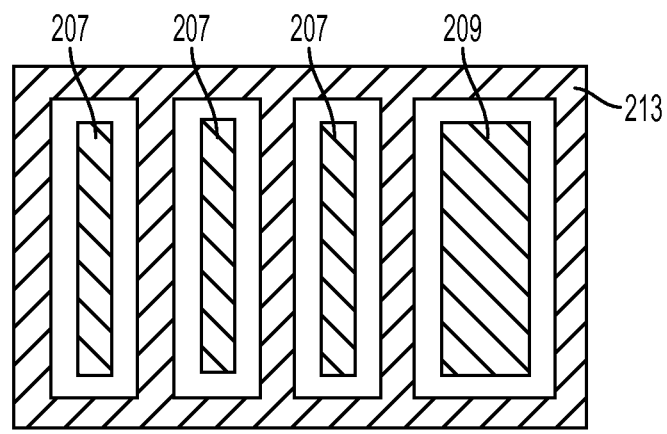

Subsequently, spacer layer 211 and second layer 213 may be etched back to mandrels 207 and 209, as illustrated in FIG. 2C. As shown in FIG. 3A, spacer layer 211 surrounds each mandrel, and second layer 213 surrounds spacer layer 211. Adverting to FIGS. 2D and 3B, the portions of spacer layer 211 between mandrels 207 and second layer 213 and between second layer 213 and mandrel 209 may be removed.

Figure 2E:
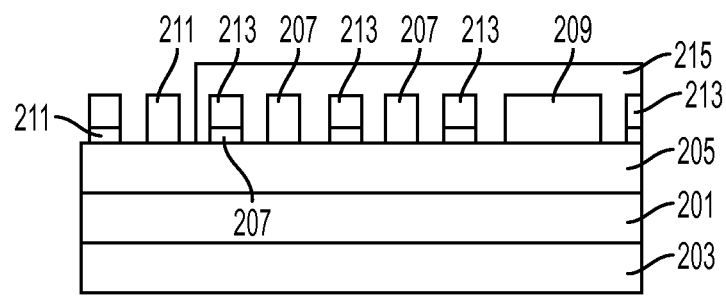
Figure 2F:
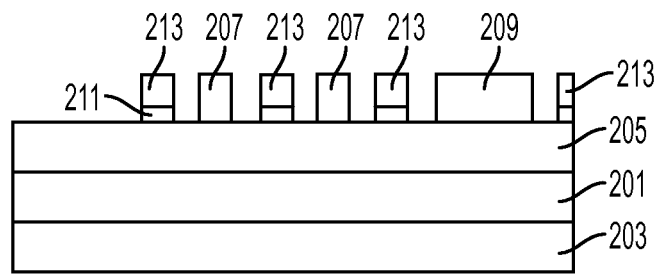
Figure 3C:
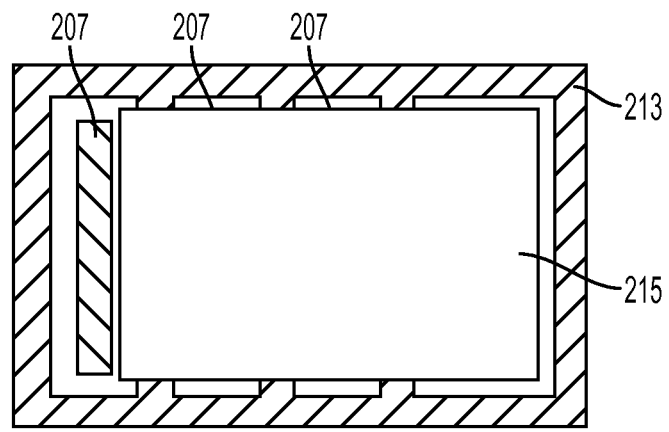
Figure 3D:
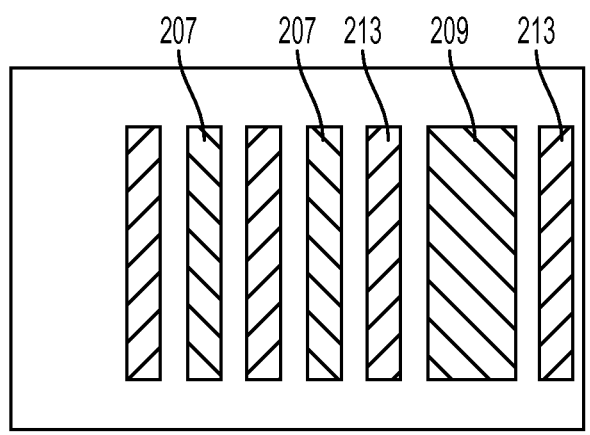

The portion of second layer 213 along the widths of the mandrels and any unnecessary mandrels or second layer 213 portions (i.e., mandrels or second layer 213 portions over that do not define target features) may then be removed using a second mask. As illustrated in FIGS. 2E and 3C, mask 215 may be formed over the substrate exposing the portions to be removed. Then, as illustrated in FIGS. 2F and 3D, the portions to be removed may be etched, e.g. lithographically or by dry etching, and the mask may be removed.

Figure 2G:
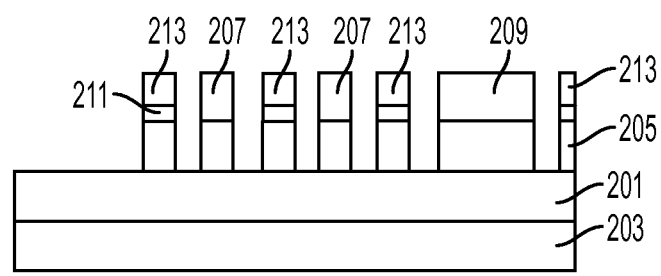
Figure 2H:
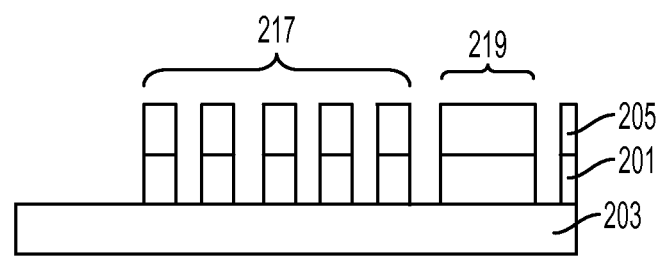

Mandrels 207 and 209 and remaining second layer 213 may be utilized to etch first layer 205, as shown in FIG. 2G. The etched portions of first layer 205 may then be used to etch target layer 201 to form first features 217 having a first critical dimension, for example less than 40 nm, and a first pitch, for example 64 nm, and one or more second features 219 having a second critical dimension greater than the first dimension, for example greater than 32 nm, and a second pitch, for example greater than 54 nm. See FIG. 2H. As described, the method according to the present exemplary embodiment requires only two masks.

Figure 4A:
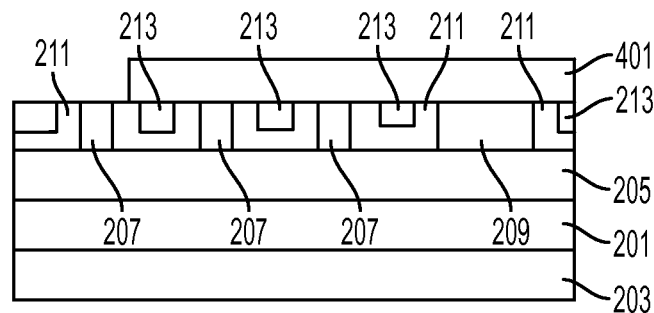
FIGS. 4A through 4C schematically illustrate sequential steps of a method in accordance with another exemplary embodiment.

FIGS. 2D and 2E show the portions of spacer layer 211 between mandrels 207 and second layer 213 and between second layer 213 and mandrel 209 being removed prior to forming second mask 215. According to another exemplary embodiment, illustrated in FIGS. 4A through 4C, the mask is formed prior to removing portions of spacer layer 211. Adverting to FIG. 4A, after spacer layer 211 and second layer 213 are etched back to mandrels 207 and 209, as illustrated in FIG. 2C, a mask 401 is formed on the substrate exposing unnecessary mandrels or second layer 213 portions (i.e., mandrels or second layer 213 portions over that do not define target features).

Figure 4B:
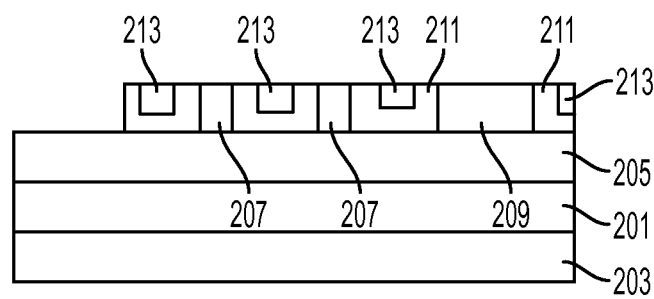
Figure 4C:
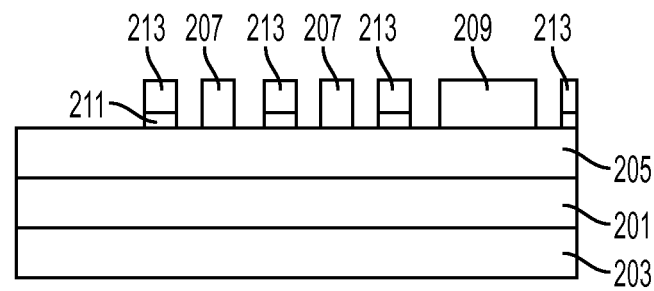

As illustrated in FIG. 4B, the portions to be removed may be etched, e.g. lithographically or by dry etching, and the mask may be removed. Next, the portions of spacer layer 211 between mandrels 207 and second layer 213 and between second layer 213 and mandrel 209 may be removed, resulting in FIG. 4C, which is identical to FIG. 2F. The process may then continue as described with respect to FIGS. 2G and 2H.

Figure 5A:
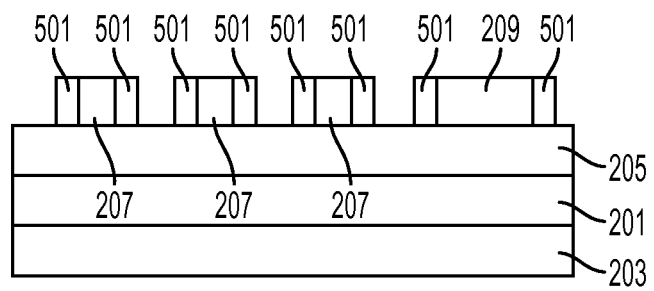
FIGS. 5A through 5H schematically illustrate sequential steps of a method in accordance with another exemplary embodiment.

Another exemplary embodiment is illustrated in FIGS. 5A through 5H. The method begins as in FIG. 2A above. However, after spacer layer 211 is deposited, horizontal portions of spacer layer 211 are etched away, leaving sidewall spacers 501, as illustrated in FIG. 5A.

Figure 5B:
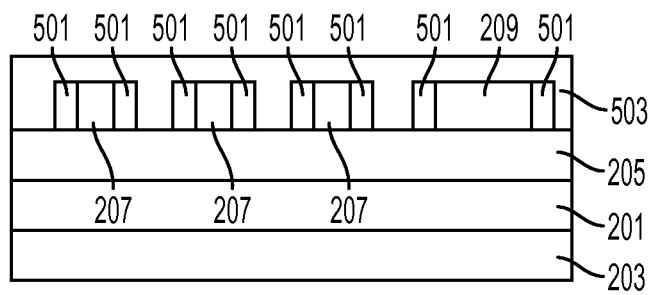
Figure 5C:
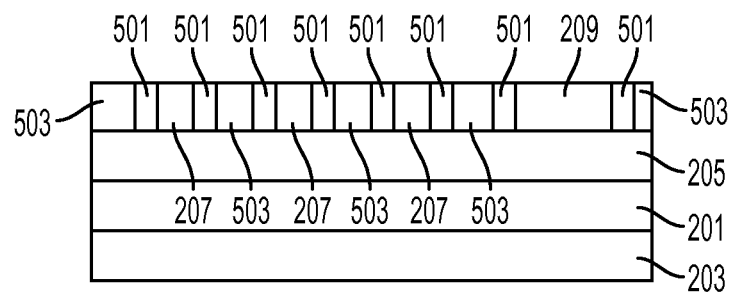

Adverting to FIG. 5B, second layer 503 is formed to fill the spaces between spacer layer 211. Second layer 503 is formed of the same materials as second layer 213. As illustrated in FIG. 5C, second layer 503 may be etched back to mandrels 207 and 209.

Figure 5D:
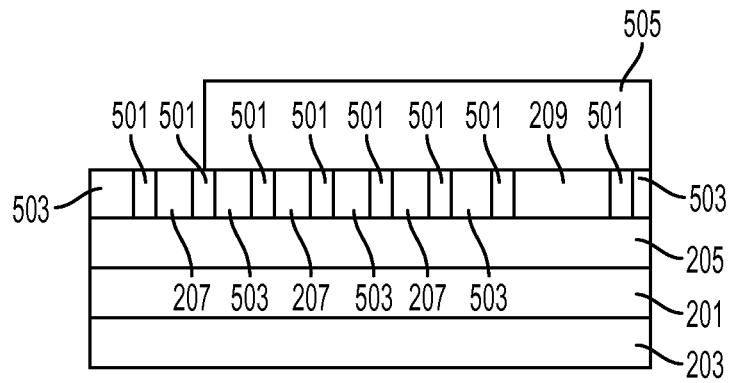

The portion of second layer 503 along the widths of the mandrels and any unnecessary mandrels or second layer 503 portions (i.e., mandrels or second layer 503 portions over that do not define target features) may then be removed using a second mask. As illustrated in FIG. 5D, mask 505 may be formed over the substrate exposing the portions to be removed. Then, the portions to be removed may be etched, e.g. lithographically or by dry etching, and the mask may be removed (see FIG. 5E). Subsequently, sidewall spacers 501 may be removed, as illustrated in FIG. 5F.

Figure 5E:
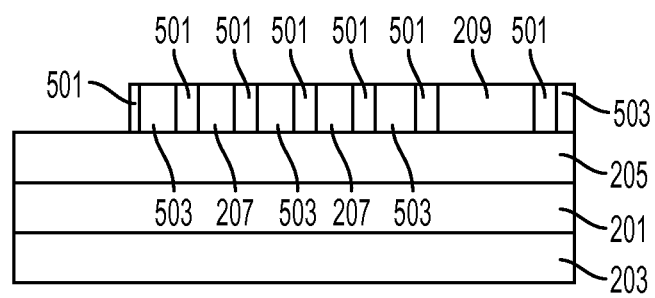
Figure 5F:
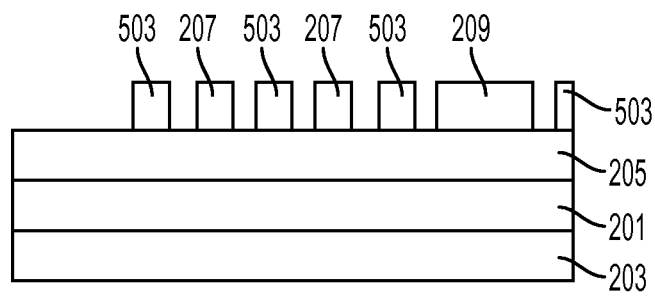
Figure 5G:
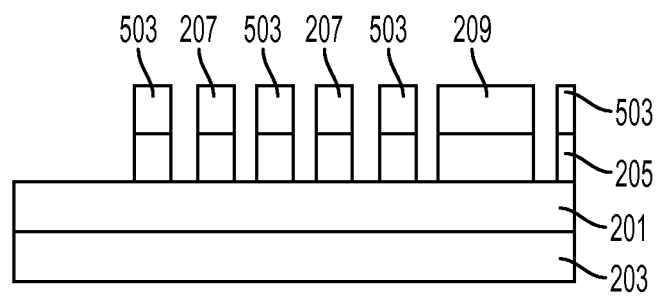

Mandrels 207 and 209 and remaining second layer 503 may be utilized to etch first layer 205, as shown in FIG. 5G. The etched portions of first layer 205 may then be used to etch target layer 201 to form first features 507 having a first critical dimension, e.g., less than 40 nm, and a first pitch, for example 64 nm, and one or more second features 509 having a second critical dimension greater than the first dimension, e.g., greater than 32 nm, and a second pitch, e.g., greater than 54 nm. See FIG. 5H.

Figure 5H:
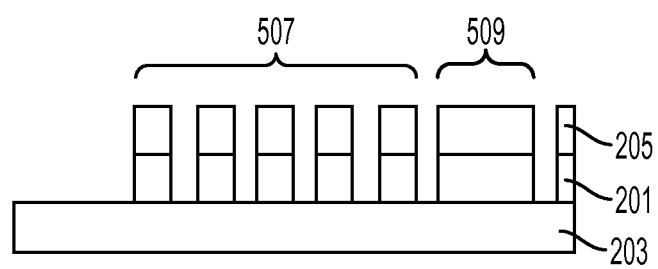
Figure 6A:
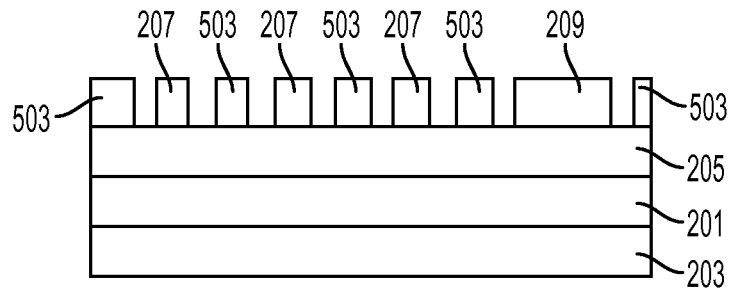
FIGS. 6A through 6C schematically illustrate sequential steps of a method in accordance with another exemplary embodiment.
Figure 6B:
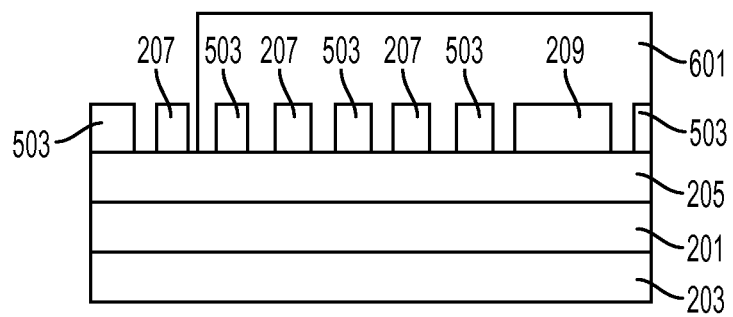
Figure 6C:
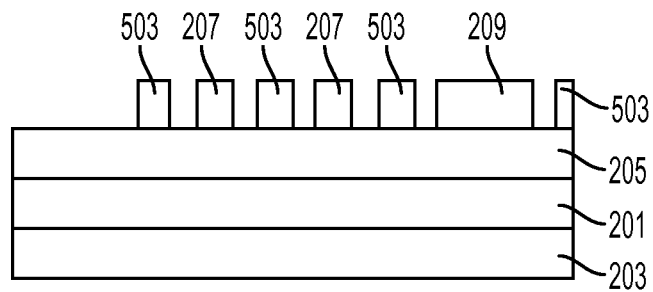

In FIGS. 5D through 5F, second mask is formed and used to remove unnecessary mandrels and second layer 503 portions followed by removal of sidewall spacers 501. According to another exemplary embodiment, illustrated in FIGS. 6A through 6C, spacers 501 are removed first (FIG. 6A), and then second mask 601 is formed (FIG. 6B), and exposed mandrels and second layer 503 portions may be removed (FIG. 6C). The process then continues as illustrated in FIGS. 5G and 5H.

A wimpy device requires third target features with a critical dimension 1 to 2 nm larger than the gate critical dimension, but with the same pitch. To add the additional features, a third mask is employed after the first two critical dimensions are defined, as previously described with respect to FIGS. 2A through 2F, 4A through 4C, 5A through 5F, or 6A through 6C. FIGS. 7A through 7D illustrate a process for fabricating a semiconductor device, such as a wimpy device, in accordance with an embodiment of the present disclosure beginning with the structure illustrated in FIG. 5F.

Figure 7A:
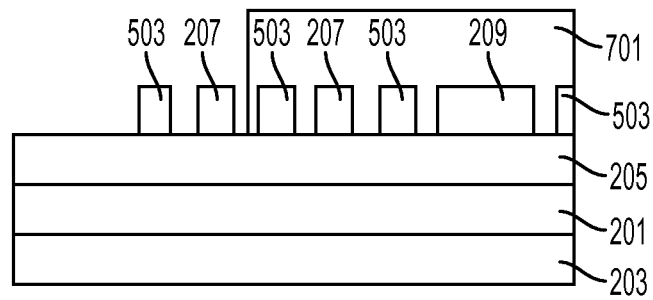
FIGS. 7A through 7E schematically illustrate sequential steps of a method in accordance with another exemplary embodiment.
Figure 7B:
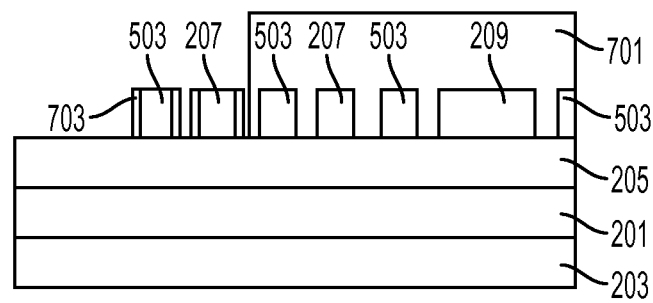
Figure 7C:
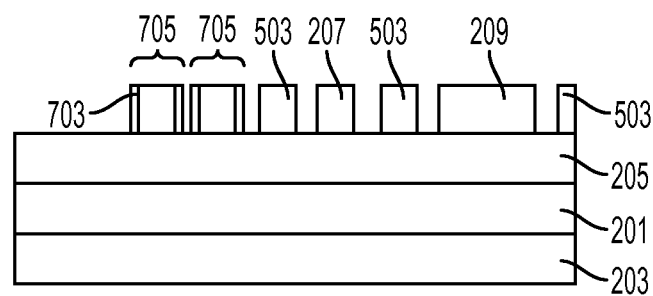

Adverting to FIG. 7A, a third mask 701 may be formed exposing mandrels 207 and second layer 503 portions that are located where the features with the third critical dimension are to be formed. Additional sidewall spacers 703 are formed on the sides of exposed mandrels 207 and second layer 503 portions to a width of 0.5 nm to 1 nm, forming structures 705, as illustrated in FIG. 7B. The critical dimension of structures 705 is thereby 1 nm to 2 nm greater than the critical dimension of mandrels 207 and second layer 503 portions. Mask 701 may then be removed, as illustrated in FIG. 7C.

Figure 7D:
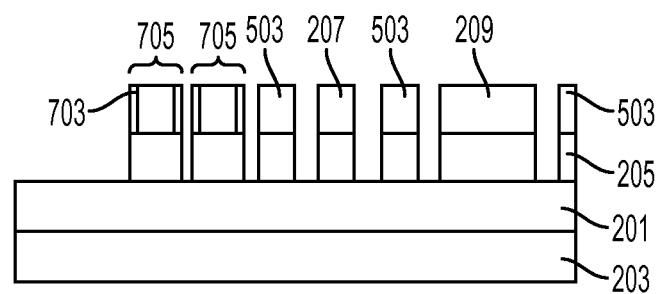
Figure 7E:
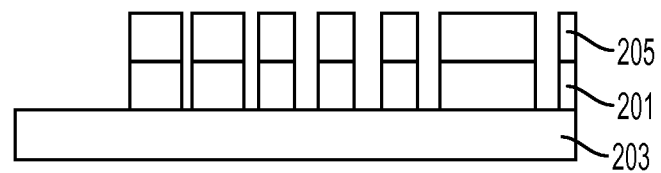

Adverting to FIG. 7D, mandrels 207 and 209, remaining second layer 503 portions, and structures 705 may be utilized to etch first layer 205. Then, the etched portions of first layer 205 may be used to etch target layer 201, as illustrated in FIG. 7E.

The embodiments of the present disclosure can achieve several technical effects, including forming sub-resolution features having different critical dimensions with a reduced number of masks. The present disclosure enjoys industrial applicability in any of various types of highly integrated semiconductor devices such as SRAMs, logic devices, and IO devices.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method of fabricating a semiconductor device, the method comprising:
    forming a plurality of first mandrels and at least one second mandrel overlying a target layer using a first mask, the first mandrels having a first width and the at least one second mandrel having a second width, the second width being greater than the first width, each of the first and second mandrels having a length;
    forming sidewall spacers along the length and width of the first and second mandrels;
    forming a filler adjacent each sidewall spacer, the filler having the first width;
    removing the filler adjacent sidewall spacers along the widths of the first and second mandrels using a second mask;
    removing the sidewall spacers; and
    etching the target layer between the filler and the first and second mandrels, thereby forming at least two target features with different dimensions using only two masks.

2. The method according to claim 1, comprising forming the sidewall spacers by conformally depositing a spacer material over the first and second mandrels and the target layer.

3. The method according to claim 2, comprising removing the spacer material between adjacent sidewall spacers prior to forming the filler.

4. The method according to claim 3, comprising removing the spacers prior to using the second mask.

5. The method according to claim 1, wherein the first width is less than 40 nanometers and the second width is greater than 20 nanometers and greater than the first width.

6. The method according to claim 1, wherein the target layer comprises an active silicon layer.

7. The method according to claim 1, wherein the target layer comprises a gate material.

8. A logic device formed by the method of claim 7.

9. A semiconductor device comprising:
    a substrate;
    a target layer on the substrate; and
    first target features having a first critical dimension, second target features having a second critical dimension, and a third target feature having a third critical dimension all formed in the target layer, the first, second, and third critical dimensions all being different from each other, and the first critical dimension being 1 nm to 2 nm greater than the second critical dimension,
    wherein a pitch between the first target features equals a pitch between the second target features.

10. The semiconductor device according to claim 9, wherein the target layer comprises a gate material.

11. The semiconductor device according to claim 9, wherein the pitch between the first target features and between the second target features is between 40 nm and 80 nm.

12. The semiconductor device according to claim 9, wherein the target layer comprises an active silicon layer.

13. A method of fabricating a semiconductor device, the method comprising:
    forming a plurality of first mandrels and at least one second mandrel overlying a target layer using a first mask, the first mandrels having a first width and the at least one second mandrel having a second width, the second width being greater than the first width, each of the first and second mandrels having a length;
    forming first sidewall spacers along the length and width of the first and second mandrels;
    forming a filler adjacent each first sidewall spacer, the filler having the first width;
    removing the filler adjacent first sidewall spacers along the widths of the first and second mandrels using a second mask;
    removing the sidewall spacers;
    forming second sidewall spacers on at least one first mandrel and an adjacent filler using a third mask; and
    etching the target layer between the second sidewall spacers, between the second sidewall spacers and the adjacent mandrel or filler, and between the filler and the first and second mandrels, thereby forming first, second, and third target features with different dimensions using only three masks, wherein the pitch between the first target features equals the pitch between the second target features.

14. The method according to claim 13, comprising forming the first sidewall spacers by conformally depositing a spacer material over the first and second mandrels and the target layer.

15. The method according to claim 14, comprising removing the spacer material between adjacent first sidewall spacers prior to forming the filler.

16. The method according to claim 15, comprising removing the first sidewall spacers prior to using the second mask.

17. The method according to claim 13, wherein the target layer comprises a gate material.

* * * * *